(12) United States Patent
Tain et al.

(10) Patent No.: US 6,319,752 B1
(45) Date of Patent: Nov. 20, 2001

(54) SINGLE-LAYER AUTOROUTER

(75) Inventors: Alexander Tain, Milpitas; Joan L. Tan, Santa Clara; Valerie Vivares, Palo Alto, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/556,304

(22) Filed: Apr. 24, 2000

(51) Int. Cl.$^7$ .......................... H01L 21/44; H01L 21/48; H01L 21/50

(52) U.S. Cl. .......................... 438/110; 438/107; 438/108; 438/612; 438/613

(58) Field of Search .................................. 438/106, 107, 438/108, 110, 611, 612, 613

(56) References Cited

U.S. PATENT DOCUMENTS 5,399,898 * 3/1995 Rostoker .
5,957,370 * 9/1999 Galloway .

* cited by examiner

*Primary Examiner*—Kevin M. Picardat
*Assistant Examiner*—D. M. Collins

(57) ABSTRACT

A novel method of automatically routing connections from bumps on a die to package pins in an advanced IC package such as a flip-chip package. The method involves creating graphic presentations of the die having the bumps and the package having pins, and placing the graphic presentation of the die into the graphic presentation of the package. If a netlist identifying interconnections between the bumps and the pins is available, the best route from a bump on the die to a corresponding package pin identified in the netlist is generated in accordance with preset requirements. If the netlist is not available, the best route from the bump to any package pin is generated in accordance with the preset requirements.

8 Claims, 4 Drawing Sheets

SINGLE-LAYER AUTOROUTER

FIELD OF THE INVENTION

The present application relates to manufacturing integrated circuit packages, and more specifically, to an autorouter for routing the die bumps to the package pins in an advanced integrated circuit package.

BACKGROUND ART

With the increasing complexity of large-scale integrated circuit chips, the number of input and output connections that have to be made to a chip has correspondingly increased. This trend has encouraged the evolution from dual in-line chip packages, which have two parallel rows of connection pins, to smaller and denser leadless chip carriers. Leadless chip carriers generally consist of a package containing a square plate of ceramic, such as alumina, which forms a chip carrier or base onto which a chip is mounted. The chip carrier is then surface mounted, usually onto a generally larger printed circuit board or other ceramic chip carriers, simply by placing the carrier on top of corresponding contact pads which mirror those contact pads of the chip carrier.

An electrical and mechanical connection is then made by soldering the chip carrier to this generally larger board by reflow soldering. Electrical connection paths within the leadless chip carrier allow the pads of the chip to be brought to external contact pads formed around each of the four sides of the ceramic base of the carrier. One technique for providing the electrical connection path comprises wire bonding of the leads of the chip to the external contacts. During this process very thin wires may be manually or automatically placed between the die pads and the bond fingers of the package to provide the electrical connections. This arrangement is less cumbersome than mounting dual in-line packages onto a board and allows greater density of input and output connections to be achieved.

In order to eliminate the expense, and complexity of wire bonding process, a so-called flip-chip technology was initiated. In this technology a bumped chip or die which carries a pad arrangement on a major top surface is turned upside-down, i.e. flipped, allowing direct coupling between the pads and matching contacts on the main circuit board or the chip carrier. The direct connection is facilitated by growing solder or gold bumps formed on the chip's input/output terminals. The flipped bumped chip is otherwise referred to as a flip-chip. The flip-chip is then aligned to the chip carrier and all connections are made simultaneously by reflowing the solder.

As schematically illustrated in FIG. 1, a flip-chip package 10 comprises a die 12 mounted on a die carrier or package 14. The die 12 includes an array of bumps 16 which are bonded to the package 14. Pins 18 corresponding to the bumps 16 are provided on the package 14 for connecting the flip-chip package 10 to a printed circuit board (PCB) 20.

One of the first steps in the flip-chip package design is routing the bumps 16 to the package pins 18. Traditional drafting packages commonly used for traditional IC package design have proven inadequate for advanced IC package design, such as flip-chip package design. Designer productivity and the quality of the final results are limited due to the lack of specialized capabilities in the tool, such as the ability to treat the chip and the chip carrier as a single open area as required for flip-chip package design.

Traditional PCB layout tools and software based on them are likewise limited in their usefulness for advanced IC package design. For example, because PCB layout tools focus on managing complex logical interconnects among large number of nets and components, they typically draw data from netlists. By contrast, the logic of a single-chip package is relatively simple—designers focus on connecting the chip bump to the most convenient package pin for maximum density.

While drafting packages and modified PCB layout tools can be used to design flip-chip packages in low volumes, the design process is slow and the results rarely optimized for production. Therefore, when manufacturing companies begin to adopt advanced IC packaging in higher volumes, routing tools developed specifically for the unique challenges of IC package design become necessary to achieve higher throughput and manufacturing yields.

Accordingly, it would be desirable to create a single-layer autorouter for routing interconnects in advanced IC packages such as flip-chip packages.

SUMMARY OF THE INVENTION

The present invention offers a novel method of automatically routing connections from bumps on a die to package pins in an advanced IC package such as a flip-chip package. The method involves creating graphic presentations of the die having bumps and the package having pins, and placing the graphic presentation of the die into the graphic presentation of the package. If a netlist identifying interconnections between the bumps and the pins is available, a route from a bump on the die to a corresponding package pin identified in the netlist is generated in accordance with preset requirements.

However, if the netlist is not available, the method involves generating a route from the bump to any package pin in accordance with the preset requirements.

In accordance with a preferred embodiment of the invention, the preset requirements may include:

providing the shortest route from the bump to the pin.

providing a route from the bump to the pin that does not cross any route from another bump to another pin.

maintaining a distance between routes from the bumps to the pins greater than a predetermined value.

The graphical presentation of the die may be created using a computer-aided design tool. The graphic presentation of the package may be created using Advanced Package Design software.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Although the present invention has general applicability for routing interconnects in advanced IC packages, the best mode for practicing the invention is described with an example of a single-layer autorouter for performing routing for flip-flop package design.

Figure 1:
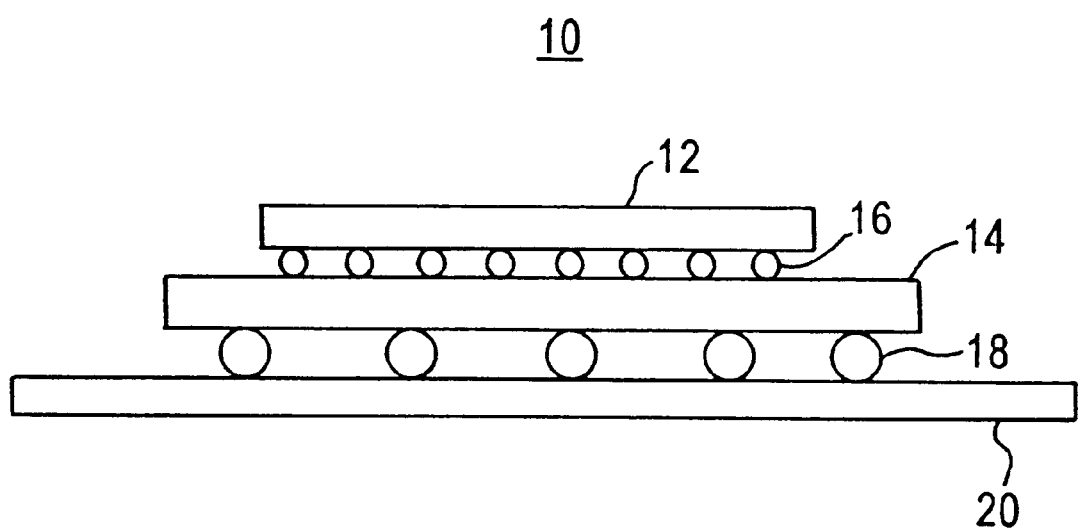
FIG. 1 illustrates a flip-chip package.
Figure 2:
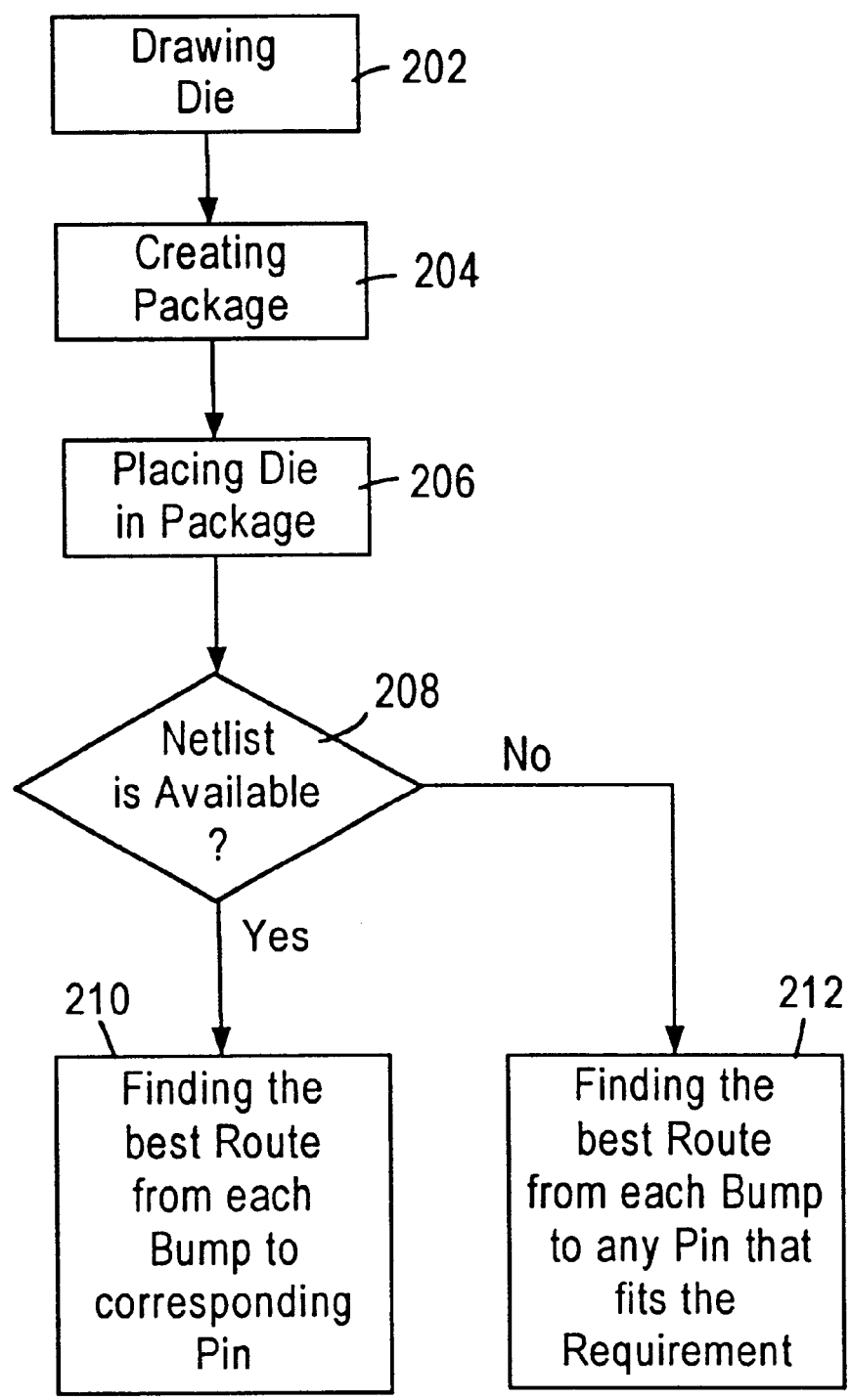
FIG. 2 is a flow diagram illustrating a routing procedure of the present invention.

FIG. 2 shows a flow chart illustrating a single-layer autorouter procedure of the present invention. In step 202, a die for a flip-flop package is drawn, and a bump pattern is created on the die. Each bump of the bump pattern is labeled to identify a particular bump. For example, AutoCAD program may be used for drawing and labeling the die and bump pattern. AutoCAD is a general-purpose computer aided drafting application program designed for use on a single-user, desktop personal computers and graphic workstations.

Figure 3:
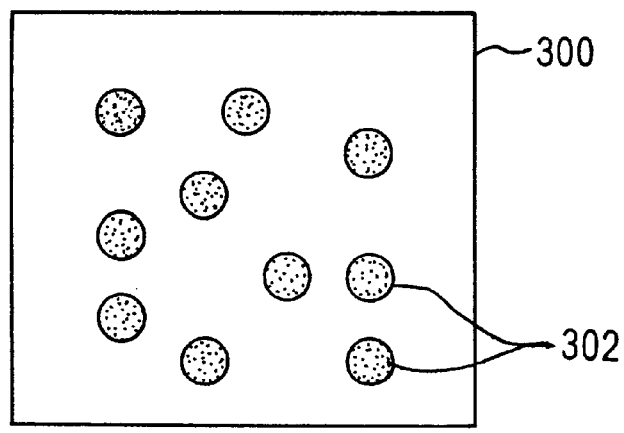
FIG. 3 illustrates a die with a bump pattern.

FIG. 3 illustrates the drawing of a die 300 made using AutoCAD. The die comprises a pattern of bumps 302, each of which is provided with a label identifying a particular bump.

Figure 4:
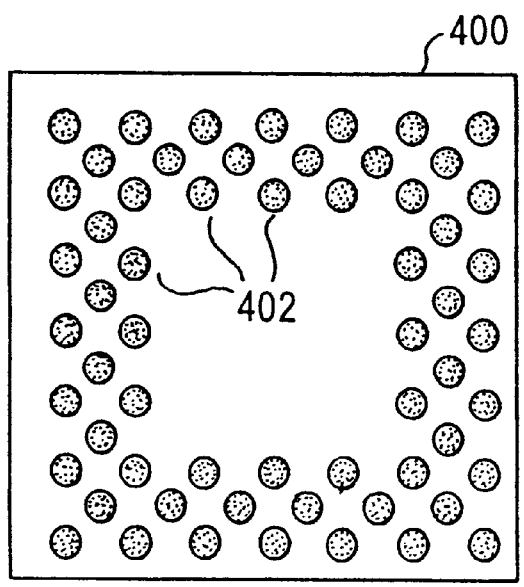
FIG. 4 illustrates a package with a pin pattern.

Then, a design tool, such as Advanced Package Design (APD) software, is used to create a graphic presentation of a package with a pin pattern (step 204). FIG. 4 illustrates a package 400 having pins 402. Each of the pins 402 is provided with a label identifying a particular pin.

Figure 5:
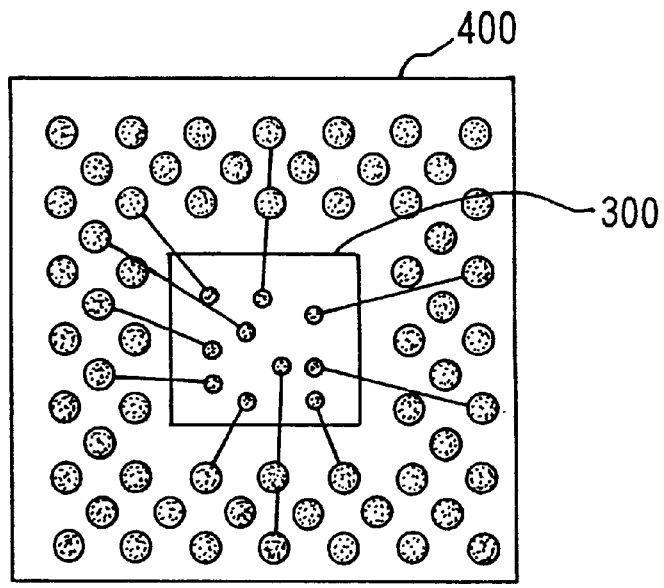
FIG. 5 shows rat connections between bumps and pins.
Figure 6:
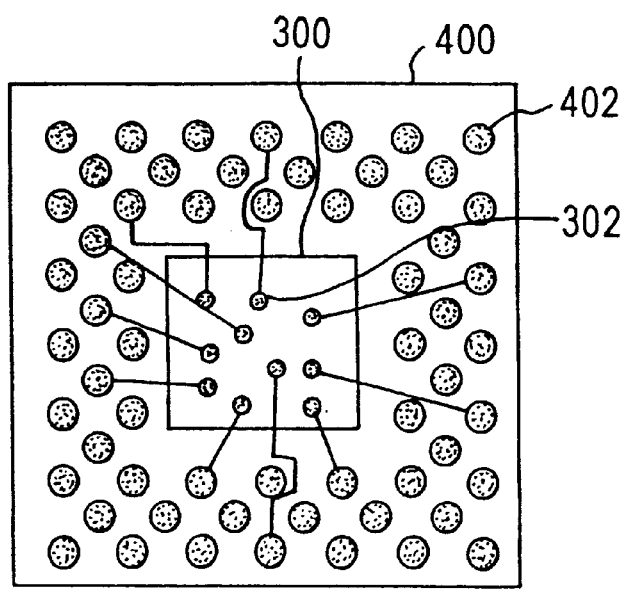
FIG. 6 illustrates routes generated in accordance with the present invention.

In step 206, the graphic presentation of die 300 converted from the AutoCAD format into the APD format is placed in a central portion of the graphic presentation of the package 400. FIG. 5 illustrates the die 300 placed in the package 400.

In step 208, the autorouter determines whether a netlist identifying fixed connections between the bumps 302 and pins 402 is provided. If the netlist exists, the autorouter finds the best route from each bump 302 to the corresponding pin 402 (step 210) as specified by the netlist. FIG. 5 illustrates rat connections between the bumps 302 and pins 402. The rat connections are generated to provide routes from the bumps 302 to the pins 402 without taking into consideration requirements for such routes. For example, routes created during rat generation may cross each other or be at an unacceptable distance from each other.

The autorouter of the present invention generates the best route from each bump 302 to the pin 402 designated in the netlist for a given bump. In accordance with the present invention, to generate the best route, the autorouter follows a number of rules including the following:

1) the autorouter finds the shortest route from the bump 302 to the corresponding pin 402;

2) the route from the bump 302 to the pin 402 cannot cross any other route from a bump to a pin;

3) the distance between each of the routes from the bump 302 to the route 402 must be greater than a preset value.

FIG. 5 illustrates the flip-chip package 400 having the routes from the bumps 302 to the pins 402 generated based on the above-defined rules.

If in step 208 the autorouter determines that the netlist identifying fixed connections between the bumps 302 and pins 402 is not provided, the autorouter performs the generation of a route from each bump 302 to any pin 402 based on the above-defined rules. In particular, for each bump 302, the autorouter finds the pin 402 so as to meet the following requirements:

1) the shortest possible route must be provided from the bump 302 to the pin 402;

2) the route from the bump 302 to the pin 402 cannot cross any other route from a bump to a pin;

3) the distance between the routes must be greater than the preset value.

In accordance with a preferred embodiment of the present invention, steps 204–212 may be performed using the Advanced Package Design (APD) software.

Thus, the present invention provides a single-layer autorouter that follows preset routing restrictions to enable a designer to effectively perform a routing procedure. While a routing procedure using conventional routing tools requires from a few hours to several days to come up with the most efficient routes from die bumps to package pins, the autorouter of the present invention enables the designer to perform routing for several minutes. This step may be performed using the SPECTRA software.

Further, as described above, the autorouter of the present invention enables the designer to perform a routing procedure without a netlist identifying the package pin to be connected to each bump on the die.

In this disclosure, there are shown and described only the preferred embodiment of the invention, but it is to be understood that the invention is capable of changes and modifications within the scope of the inventive concept as expressed herein.

What is claimed is:

1. A method of automatically routing connections from bumps on a die to package pins in an IC package, the method comprising the steps of:

creating graphic presentations of the die having the bumps and the package having pins, placing the graphic presentation of the die into the graphic presentation of the package, determining whether a netlist identifying interconnections between the bumps and the pins is available, and if the netlist is available, generating a route from a bump on the die to a corresponding package pin identified in the netlist in accordance with preset requirements.

2. The method of claim 1, further comprising the step of generating a route from the bump to any package pin in accordance with the preset requirements, if the netlist is not available.

3. The method of claim 1, wherein the preset requirements include providing the shortest route from the bump to the pin.

4. The method of claim 1, wherein the preset requirements include providing a route from the bump to the pin that does not cross any route from another bump to another pin.

5. The method of claim 1, wherein the preset requirements include maintaining distance between routes from the bumps to the pins greater than a predetermined value.

6. The method of claim 1, wherein the graphical presentation of the die is created using a computer-aided design tool.

7. The method of claim 6, wherein the graphic presentation of the package is created using Advanced Package Design software.

8. The method of claim 1, wherein the package is a flip-chip package.

* * * * *